United States Patent
Harrison (10) Patent No.: US 7,418,071 B2
(45) Date of Patent: *Aug. 26, 2008

(54) METHOD AND APPARATUS FOR GENERATING A PHASE DEPENDENT CONTROL SIGNAL

(75) Inventor: Ronnie M. Harrison, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 318 days.

This patent is subject to a terminal disclaimer.

(21) Appl. No.: 11/203,511

(22) Filed: Aug. 12, 2005

(65) Prior Publication Data

US 2005/0286505 A1    Dec. 29, 2005

Related U.S. Application Data

(63) Continuation of application No. 10/186,471, filed on Jun. 28, 2002, now Pat. No. 7,016,451, which is a continuation of application No. 09/260,212, filed on Mar. 1, 1999, now Pat. No. 6,470,060.

(51) Int. Cl.
*H03D 3/24* (2006.01)
*G01R 25/00* (2006.01)
*H03L 7/06* (2006.01)

(52) U.S. Cl. ............... 375/374; 327/3; 327/148; 327/157

(58) Field of Classification Search ......... 375/373, 375/374, 375, 376; 327/12, 156, 152, 159, 327/162, 148, 157; 331/11, 25, 1 A, 16, 331/34, 185, 57, 173; 326/55, 115
See application file for complete search history.

(56) References Cited

U.S. PATENT DOCUMENTS 3,633,174 A    1/1972   Griffin ............... 340/172.5

(Continued)

FOREIGN PATENT DOCUMENTS

EP    0 171 720 A2    2/1986

(Continued)

OTHER PUBLICATIONS

Sidiropoulos, S. et al., "A Semidigital Dual Delay-Locked Loop", IEEE Journal of Solid-State Circuits, vol. 32, No. 11, Nov. 1997. pp. 1683-1692.

(Continued)

*Primary Examiner*—Mohammad H. Ghayour
*Assistant Examiner*—Lawrence B Williams
(74) *Attorney, Agent, or Firm*—Dorsey & Whitney LLP (57) ABSTRACT

A phase detector generates a phase dependent control signal according to the phase relationship between a first and second clock signal. The phase detector includes first and second phase detector circuits receiving the first and second clock signals and generating select signals having duty cycles corresponding to the phase relationship between the clock edges of the first and second clock signals. The phase detector also includes a charge pump that receives select signals from the phase detector circuits and produces an increasing or decreasing control signal when the first and second clock signals do not have the predetermined phase relationship, and a non-varying control signal when the first and second clock signals do have the predetermined phase relationship. The control signal may be used to adjust the delay value of a voltage-controlled delay circuit in order to adjust the phase relationship between the first and second clock signals to have a predetermined phase relationship.

18 Claims, 6 Drawing Sheets

U.S. PATENT DOCUMENTS

| | | | |
|---|---|---|---|
| 4,004,100 A | 1/1977 | Takimoto | 179/15 BS |
| 4,077,016 A | 2/1978 | Sanders et al. | 331/4 |
| 4,096,402 A | 6/1978 | Schroeder et al. | 307/362 |
| 4,404,474 A | 9/1983 | Dingwall | 307/260 |
| 4,481,625 A | 11/1984 | Roberts et al. | 370/85 |
| 4,508,983 A | 4/1985 | Allgood et al. | 307/577 |
| 4,511,846 A | 4/1985 | Nagy et al. | 328/164 |
| 4,514,647 A | 4/1985 | Shoji | 307/269 |
| 4,524,448 A | 6/1985 | Hullwegen | 375/118 |
| 4,573,017 A | 2/1986 | Levine | 327/114 |
| 4,600,895 A | 7/1986 | Landsman | 331/1 A |
| 4,603,320 A | 7/1986 | Farago | 341/89 |
| 4,638,187 A | 1/1987 | Boler et al. | 307/451 |
| 4,638,451 A | 1/1987 | Hester et al. | 395/889 |
| 4,687,951 A | 8/1987 | McElroy | 307/269 |
| 4,697,167 A | 9/1987 | O'Keeffe et al. | 340/347 |
| 4,727,541 A | 2/1988 | Mori et al. | 370/112 |
| 4,740,962 A | 4/1988 | Kish, III | 370/102 |
| 4,746,996 A | 5/1988 | Furuhata et al. | 360/36.2 |
| 4,773,085 A | 9/1988 | Cordell | 375/120 |
| 4,789,796 A | 12/1988 | Foss | 307/443 |
| 4,791,622 A | 12/1988 | Clay et al. | 369/59 |
| 4,818,995 A | 4/1989 | Takahashi et al. | 341/94 |
| 4,893,087 A | 1/1990 | Davis | 328/14 |
| 4,902,986 A | 2/1990 | Lesmeister | 331/25 |
| 4,924,516 A | 5/1990 | Bremer et al. | 380/46 |
| 4,953,128 A | 8/1990 | Kawai et al. | 365/194 |
| 4,958,088 A | 9/1990 | Farah-Bakhsh et al. | 307/443 |
| 4,972,470 A | 11/1990 | Farago | 380/3 |
| 4,979,185 A | 12/1990 | Bryans et al. | 375/20 |
| 4,984,204 A | 1/1991 | Sato et al. | 365/189.11 |
| 4,984,255 A | 1/1991 | Davis et al. | 375/106 |
| 5,020,023 A | 5/1991 | Smith | 364/900 |
| 5,038,115 A | 8/1991 | Myers et al. | 331/2 |
| 5,062,082 A | 10/1991 | Choi | 365/230.06 |
| 5,075,569 A | 12/1991 | Branson | 307/270 |
| 5,086,500 A | 2/1992 | Greub | 395/550 |
| 5,087,828 A | 2/1992 | Sato et al. | 307/269 |
| 5,113,519 A | 5/1992 | Johnson et al. | 395/600 |
| 5,120,990 A | 6/1992 | Koker | 307/269 |
| 5,122,690 A | 6/1992 | Bianchi | 307/475 |
| 5,128,560 A | 7/1992 | Chern et al. | 307/475 |
| 5,128,563 A | 7/1992 | Hush et al. | 307/482 |
| 5,130,565 A | 7/1992 | Girmay | 307/265 |
| 5,134,311 A | 7/1992 | Biber et al. | 307/270 |
| 5,150,186 A | 9/1992 | Pinney et al. | 357/42 |
| 5,165,046 A | 11/1992 | Hesson | 307/270 |
| 5,168,199 A | 12/1992 | Huffman et al. | 315/370 |
| 5,179,298 A | 1/1993 | Hirano et al. | 307/443 |
| 5,182,524 A | 1/1993 | Hopkins | 330/149 |
| 5,194,765 A | 3/1993 | Dunlop et al. | 307/443 |
| 5,212,601 A | 5/1993 | Wilson | 360/51 |
| 5,220,208 A | 6/1993 | Schenck | 307/443 |
| 5,223,755 A | 6/1993 | Richley | 307/603 |
| 5,229,929 A | 7/1993 | Shimizu et al. | 363/98 |
| 5,233,314 A | 8/1993 | McDermott et al. | 331/17 |
| 5,233,564 A | 8/1993 | Ohshima et al. | 365/230.05 |
| 5,239,206 A | 8/1993 | Yanai | 307/272.2 |
| 5,243,703 A | 9/1993 | Farmwald et al. | 395/325 |
| 5,254,883 A | 10/1993 | Horowitz et al. | 307/443 |
| 5,256,989 A | 10/1993 | Parker et al. | 331/1 A |
| 5,257,294 A | 10/1993 | Pinto et al. | 375/120 |
| 5,268,639 A | 12/1993 | Gasbarro et al. | 324/158 R |
| 5,272,729 A | 12/1993 | Bechade et al. | 375/118 |
| 5,274,276 A | 12/1993 | Casper et al. | 307/443 |
| 5,276,642 A | 1/1994 | Lee | 365/189.04 |
| 5,278,460 A | 1/1994 | Casper | 307/296.5 |
| 5,281,865 A | 1/1994 | Yamashita et al. | 307/279 |
| 5,283,631 A | 2/1994 | Koerner et al. | 307/451 |
| 5,289,580 A | 2/1994 | Latif et al. | 395/275 |
| 5,295,164 A | 3/1994 | Yamamura | 375/120 |
| 5,304,952 A | 4/1994 | Quiet et al. | 331/1 A |
| 5,311,481 A | 5/1994 | Casper et al. | 365/230.06 |
| 5,311,483 A | 5/1994 | Takasugi | 365/233 |
| 5,313,431 A | 5/1994 | Uruma et al. | 365/230.05 |
| 5,315,269 A | 5/1994 | Fujii | 331/1 A |
| 5,315,388 A | 5/1994 | Shen et al. | 348/718 |
| 5,321,368 A | 6/1994 | Hoelzle | 328/63 |
| 5,337,285 A | 8/1994 | Ware et al. | 365/227 |
| 5,341,405 A | 8/1994 | Mallard, Jr. | 375/120 |
| 5,347,177 A | 9/1994 | Lipp | 307/443 |
| 5,347,179 A | 9/1994 | Casper et al. | 307/451 |
| 5,355,391 A | 10/1994 | Horowitz et al. | 375/36 |
| 5,361,002 A | 11/1994 | Casper | 327/530 |
| 5,367,649 A | 11/1994 | Cedar | 395/375 |
| 5,379,299 A | 1/1995 | Schwartz | 370/108 |
| 5,390,308 A | 2/1995 | Ware et al. | 395/400 |
| 5,400,283 A | 3/1995 | Raad | 365/203 |
| 5,402,389 A | 3/1995 | Flannagan et al. | 365/233 |
| 5,408,640 A | 4/1995 | MacIntyre et al. | 395/550 |
| 5,410,263 A | 4/1995 | Waizman | 327/141 |
| 5,416,436 A | 5/1995 | Rainard | 327/270 |
| 5,416,909 A | 5/1995 | Long et al. | 395/275 |
| 5,420,544 A | 5/1995 | Ishibashi | 331/11 |
| 5,424,687 A | 6/1995 | Fukuda | 331/11 |
| 5,428,311 A | 6/1995 | McClure | 327/276 |
| 5,428,317 A | 6/1995 | Sanchez et al. | 331/1 A |
| 5,430,408 A | 7/1995 | Ovens et al. | 327/407 |
| 5,430,676 A | 7/1995 | Ware et al. | 365/189.02 |
| 5,432,823 A | 7/1995 | Gasbarro et al. | 375/356 |
| 5,438,545 A | 8/1995 | Sim | 365/189.05 |
| 5,440,260 A | 8/1995 | Hayashi et al. | 327/278 |
| 5,440,514 A | 8/1995 | Flannagan et al. | 365/194 |
| 5,444,667 A | 8/1995 | Obara | 365/233 |
| 5,446,696 A | 8/1995 | Ware et al. | 365/222 |
| 5,448,193 A | 9/1995 | Baumert et al. | 327/156 |
| 5,451,898 A | 9/1995 | Johnson | 327/563 |
| 5,457,407 A | 10/1995 | Shu et al. | 326/30 |
| 5,463,337 A | 10/1995 | Leonowich | 327/158 |
| 5,465,076 A | 11/1995 | Yamauchi et al. | 331/179 |
| 5,473,274 A | 12/1995 | Reilly et al. | 327/159 |
| 5,473,575 A | 12/1995 | Farmwald et al. | 365/230.06 |
| 5,473,639 A | 12/1995 | Lee et al. | 375/376 |
| 5,485,490 A | 1/1996 | Leung et al. | 375/371 |
| 5,488,321 A | 1/1996 | Johnson | 327/66 |
| 5,489,864 A | 2/1996 | Ashuri | 327/161 |
| 5,497,127 A | 3/1996 | Sauer | 331/17 |
| 5,497,355 A | 3/1996 | Mills et al. | 365/230.08 |
| 5,498,990 A | 3/1996 | Leung et al. | 327/323 |
| 5,500,808 A | 3/1996 | Wang | 364/578 |
| 5,502,672 A | 3/1996 | Kwon | 365/189.05 |
| 5,506,814 A | 4/1996 | Hush et al. | 365/230.03 |
| 5,508,638 A | 4/1996 | Cowles et al. | 326/38 |
| 5,513,327 A | 4/1996 | Farmwald et al. | 395/309 |
| 5,515,403 A | 5/1996 | Sloan et al. | 375/371 |
| 5,532,714 A | 7/1996 | Knapp et al. | 345/114 |
| 5,539,345 A * | 7/1996 | Hawkins | 327/150 |
| 5,544,124 A | 8/1996 | Zagar et al. | 365/230.08 |
| 5,544,203 A | 8/1996 | Casasanta et al. | 375/376 |
| 5,550,515 A | 8/1996 | Liang et al. | 331/11 |
| 5,550,549 A * | 8/1996 | Procter et al. | 342/47 |
| 5,550,783 A | 8/1996 | Stephens, Jr. et al. | 365/233 |
| 5,552,727 A | 9/1996 | Nakao | 327/159 |
| 5,555,429 A | 9/1996 | Parkinson et al. | 395/800 |
| 5,557,224 A | 9/1996 | Wright et al. | 327/115 |
| 5,557,781 A | 9/1996 | Stones et al. | 395/550 |
| 5,563,546 A | 10/1996 | Tsukada | 327/408 |
| 5,568,075 A | 10/1996 | Curran et al. | 327/172 |
| 5,568,077 A | 10/1996 | Sato et al. | 327/199 |
| 5,572,557 A | 11/1996 | Aoki | 375/376 |
| 5,572,722 A | 11/1996 | Vogley | 395/555 |
| 5,574,698 A | 11/1996 | Raad | 365/230.06 |
| 5,576,645 A | 11/1996 | Farwell | 327/94 |
| 5,577,079 A | 11/1996 | Zenno et al. | 375/373 |

| | | | |
|---|---|---|---|
| 5,577,236 A | 11/1996 | Johnson et al. ............. 395/551 |
| 5,578,940 A | 11/1996 | Dillon et al. .................. 326/30 |
| 5,578,941 A | 11/1996 | Sher et al. ..................... 326/34 |
| 5,579,326 A | 11/1996 | McClure ........................ 371/61 |
| 5,581,197 A | 12/1996 | Motley et al. .................. 326/30 |
| 5,589,788 A | 12/1996 | Goto ........................... 327/276 |
| 5,590,073 A | 12/1996 | Arakawa et al. ........ 365/185.08 |
| 5,594,690 A | 1/1997 | Rothenberger et al. . 365/189.01 |
| 5,610,558 A * | 3/1997 | Mittel et al. .................... 331/2 |
| 5,614,855 A | 3/1997 | Lee et al. ..................... 327/158 |
| 5,619,473 A | 4/1997 | Hotta ......................... 365/238.5 |
| 5,621,340 A | 4/1997 | Lee et al. ....................... 327/65 |
| 5,621,690 A | 4/1997 | Jungroth et al. ............. 365/200 |
| 5,621,739 A | 4/1997 | Sine et al. .................... 371/22.1 |
| 5,623,523 A * | 4/1997 | Gehrke ....................... 375/376 |
| 5,627,780 A | 5/1997 | Malhi .................... 365/185.09 |
| 5,627,791 A | 5/1997 | Wright et al. ................. 365/222 |
| 5,631,872 A | 5/1997 | Naritake et al. .............. 365/227 |
| 5,636,163 A | 6/1997 | Furutani et al. .............. 365/233 |
| 5,636,173 A | 6/1997 | Schaefer .................. 365/230.03 |
| 5,636,174 A | 6/1997 | Rao ......................... 365/230.03 |
| 5,638,335 A | 6/1997 | Akiyama et al. ......... 365/230.03 |
| 5,644,743 A * | 7/1997 | Barrett et al. .................. 375/375 |
| 5,646,904 A | 7/1997 | Ohno et al. .................. 365/233 |
| 5,652,530 A | 7/1997 | Ashuri ......................... 326/93 |
| 5,657,289 A | 8/1997 | Hush et al. .............. 365/230.05 |
| 5,657,481 A | 8/1997 | Farmwald et al. ............ 395/551 |
| 5,663,921 A | 9/1997 | Pascucci et al. .............. 365/233 |
| 5,666,313 A | 9/1997 | Ichiguchi ..................... 365/195 |
| 5,666,322 A | 9/1997 | Conkle ....................... 365/233 |
| 5,668,763 A | 9/1997 | Fujioka et al. ............... 365/200 |
| 5,668,774 A | 9/1997 | Furatani ....................... 365/233 |
| 5,673,005 A | 9/1997 | Pricer ......................... 331/1 R |
| 5,675,274 A | 10/1997 | Kobayashi et al. ............ 327/158 |
| 5,675,588 A | 10/1997 | Maruyama et al. .......... 371/20.4 |
| 5,692,165 A | 11/1997 | Jeddeloh et al. .............. 395/551 |
| 5,694,065 A | 12/1997 | Hamasaki et al. ............ 326/30 |
| 5,708,611 A | 1/1998 | Iwamoto ................. 365/233 X |
| 5,712,580 A | 1/1998 | Baumgartner et al. .......... 327/12 |
| 5,712,883 A | 1/1998 | Miller et al. .................. 375/371 |
| 5,719,508 A | 2/1998 | Daly ........................... 327/12 |
| 5,737,342 A | 4/1998 | Ziperovich ................. 371/25.1 |
| 5,740,123 A | 4/1998 | Uchida ........................ 365/233 |
| 5,751,665 A | 5/1998 | Tanoi ........................ 368/120 |
| 5,764,092 A | 6/1998 | Wada et al. .................. 327/271 |
| 5,767,715 A | 6/1998 | Marquis et al. .............. 327/159 |
| 5,768,177 A | 6/1998 | Sakuragi ...................... 365/194 |
| 5,774,699 A | 6/1998 | Nagae ......................... 395/551 |
| 5,778,214 A | 7/1998 | Taya et al. .................... 395/551 |
| 5,781,499 A | 7/1998 | Koshikawa .................. 365/233 |
| 5,784,422 A | 7/1998 | Heermann ................... 375/355 |
| 5,789,947 A | 8/1998 | Sato ............................. 327/3 |
| 5,790,612 A | 8/1998 | Chengson et al. ............. 375/373 |
| 5,794,020 A | 8/1998 | Tanaka et al. ................. 395/552 |
| 5,805,931 A | 9/1998 | Morzano et al. ............. 395/884 |
| 5,812,619 A | 9/1998 | Runaldue ..................... 375/376 |
| 5,822,314 A | 10/1998 | Chater-Lea .................. 370/337 |
| 5,831,545 A | 11/1998 | Murray et al. .......... 340/825.49 |
| 5,831,929 A | 11/1998 | Manning ..................... 365/233 |
| 5,841,707 A | 11/1998 | Cline et al. ................... 365/194 |
| 5,852,378 A | 12/1998 | Keeth ......................... 327/171 |
| 5,872,959 A | 2/1999 | Nguyen et al. ............... 395/552 |
| 5,889,828 A * | 3/1999 | Miyashita et al. ............ 375/374 |
| 5,889,829 A | 3/1999 | Chiao et al. .................. 375/355 |
| 5,898,242 A | 4/1999 | Peterson ..................... 327/278 |
| 5,898,674 A | 4/1999 | Mawhinney et al. ......... 370/247 |
| 5,909,130 A * | 6/1999 | Martin et al. ................... 327/12 |
| 5,917,760 A | 6/1999 | Millar ......................... 365/194 |
| 5,920,518 A | 7/1999 | Harrison et al. .............. 365/233 |
| 5,926,047 A | 7/1999 | Harrison ..................... 327/159 |
| 5,926,436 A | 7/1999 | Toda et al. .................... 365/236 |
| 5,940,608 A | 8/1999 | Manning ..................... 395/551 |
| 5,940,609 A | 8/1999 | Harrison ..................... 395/559 |
| 5,945,855 A | 8/1999 | Momtaz ...................... 327/157 |
| 5,946,244 A | 8/1999 | Manning ..................... 365/194 |
| 5,953,284 A | 9/1999 | Baker et al. .................. 365/233 |
| 5,953,386 A | 9/1999 | Anderson .................... 375/376 |
| 5,964,884 A | 10/1999 | Partovi et al. ................ 713/503 |
| 5,990,719 A | 11/1999 | Dai et al. ..................... 327/244 |
| 6,005,694 A | 12/1999 | Liu ............................. 359/110 |
| 6,005,823 A | 12/1999 | Martin et al. ............. 365/230.08 |
| 6,011,732 A | 1/2000 | Harrison et al. .............. 365/194 |
| 6,011,822 A * | 1/2000 | Dreyer ........................ 375/376 |
| 6,014,042 A | 1/2000 | Nguyen ......................... 327/3 |
| 6,016,282 A | 1/2000 | Keeth ......................... 365/233 |
| 6,021,268 A | 2/2000 | Johnson ................... 395/500.24 |
| 6,023,489 A | 2/2000 | Hatch ......................... 375/208 |
| 6,026,050 A | 2/2000 | Baker et al. .................. 635/233 |
| 6,026,134 A | 2/2000 | Duffy et al. .................. 375/376 |
| 6,029,250 A | 2/2000 | Keeth ......................... 713/400 |
| 6,038,219 A | 3/2000 | Mawhinney et al. ......... 370/242 |
| 6,067,592 A | 5/2000 | Farmwald et al. ............ 710/104 |
| 6,072,802 A | 6/2000 | Uhm et al. ................... 370/441 |
| 6,087,857 A | 7/2000 | Wang ............................. 327/5 |
| 6,101,152 A | 8/2000 | Farmwald et al. ............ 365/233 |
| 6,101,197 A | 8/2000 | Keeth et al. .................. 370/517 |
| 6,105,157 A | 8/2000 | Miller ......................... 714/744 |
| 6,115,318 A | 9/2000 | Keeth ......................... 365/233 |
| 6,119,242 A | 9/2000 | Harrison ..................... 713/503 |
| 6,125,157 A | 9/2000 | Donnelly et al. ............. 375/371 |
| 6,147,905 A | 11/2000 | Seino ..................... 365/185.11 |
| 6,147,916 A | 11/2000 | Ogura ......................... 365/203 |
| 6,150,889 A * | 11/2000 | Gulliver et al. ................ 331/14 |
| 6,160,423 A | 12/2000 | Haq ............................. 327/41 |
| 6,173,432 B1 | 1/2001 | Harrison ........................ 716/1 |
| 6,194,917 B1 * | 2/2001 | Deng ............................ 327/12 |
| 6,253,360 B1 | 6/2001 | Yoshiba ......................... 716/6 |
| 6,262,921 B1 * | 7/2001 | Manning ..................... 365/194 |
| 6,269,451 B1 | 7/2001 | Mullarkey ................... 713/401 |
| 6,285,726 B1 | 9/2001 | Gaudet ....................... 375/376 |
| 6,295,328 B1 | 9/2001 | Kim et al. .................... 375/376 |
| 6,298,450 B1 | 10/2001 | Liu et al. ..................... 713/502 |
| 6,327,196 B1 | 12/2001 | Mullarkey ................... 365/194 |
| 6,327,318 B1 | 12/2001 | Bhullar et al. ................ 375/374 |
| 6,338,127 B1 | 1/2002 | Manning ..................... 711/167 |
| 6,377,646 B1 | 4/2002 | Sha ............................. 375/376 |
| 6,378,079 B1 | 4/2002 | Mullarkey ................... 713/401 |
| 6,430,696 B1 | 8/2002 | Keeth ......................... 713/503 |
| 6,438,043 B2 | 8/2002 | Gans et al. ................... 365/194 |
| 6,442,644 B1 | 8/2002 | Gustavson et al. ........... 711/105 |
| 6,484,244 B1 | 11/2002 | Manning ..................... 711/154 |
| 6,493,320 B1 | 12/2002 | Schober et al. .............. 370/241 |
| 6,499,111 B2 | 12/2002 | Mullarkey ................... 713/401 |
| 6,526,111 B1 | 2/2003 | Prasad ........................ 375/376 |
| 6,580,531 B1 | 6/2003 | Swanson et al. .............. 359/110 |
| 6,665,222 B2 | 12/2003 | Wright et al. ................. 365/203 |
| 6,694,496 B2 | 2/2004 | Goslin et al. ................... 716/4 |
| 6,809,555 B1 * | 10/2004 | Nguyen ......................... 327/3 |

FOREIGN PATENT DOCUMENTS

| | | |
|---|---|---|
| EP | 0 295 515 A1 | 12/1988 |
| EP | 0 406 786 A1 | 1/1991 |
| EP | 0 450 871 A2 | 10/1991 |
| EP | 0 476 585 A3 | 3/1992 |
| EP | 0 655 741 A2 | 5/1995 |
| EP | 0 655 834 A1 | 5/1995 |
| EP | 0 680 049 A2 | 11/1995 |
| EP | 0 703 663 A1 | 3/1996 |
| EP | 0 704 848 A3 | 4/1996 |
| EP | 0 704 975 A1 | 4/1996 |
| EP | 0 767 538 A1 | 4/1997 |
| JP | 6-1237512 | 10/1986 |
| JP | 2-112317 | 4/1990 |
| JP | 4-135311 | 5/1992 |
| JP | 5-136664 | 6/1993 |

| | | |
|---|---|---|
| JP | 5-282868 | 10/1993 |
| JP | 0-7319577 | 12/1995 |
| WO | WO 94/29871 | 12/1994 |
| WO | WO 95/22200 | 8/1995 |
| WO | WO 95/22206 | 8/1995 |
| WO | WO 96/10866 | 4/1996 |
| WO | WO 97/14289 | 4/1997 |
| WO | WO 97/42557 | 11/1997 |

OTHER PUBLICATIONS

Alvarez, J. et al. "A Wide-Bandwidth Low Voltage PLL for PowerPC™ Microprocessors" IEEE IEICE Trans. Electron., vol. E-78. No. 6, Jun. 1995, pp. 631-639.

Anonymous, "400MHz SLDRAM, 4M×16 SLDRAM Pipelined, Eight Bank, 2.5 V Operation," SLDRAM Consortium Advance Sheet, published throughout the United States, pp. 1-22.

Anonymous, "Draft Standard for a High-Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1-56.

Anonymous, "Programmable Pulse Generator", IBM Technical Disclosure Bulletin, vol. 17, No. 12, May 1975, pp. 3553-3554.

Arai, Y. et al., "A Time Digitizer CMOS Gate-Array with a 250 ps Time Resolution", XP 000597207, IEEE Journal of Solid-State Circuits, vol. 31, No. 2, Feb. 1996, pp. 212-220.

Anonymous, "Pulse Combining Network", IBM Technical Disclosure Bulletin, vol. 32, No. 12, May 1990, pp. 149-151.

Anonymous, "Variable Delay Digital Circuit", IBM Technical Disclosure Bulletin, vol. 35, No. 4A, Sep. 1992, pp. 365-366.

Arai, Y. et. al., "A CMOS Four Channel x 1K Time Memory LSI with 1-ns/b Resolution", IEEE Journal of Solid-State Circuits, vol. 27, No. 3, M, 8107 Mar. 1992, No. 3, New York, US, pp. 59-364 and pp. 528-531.

Aviram, A. et al., "Obtaining High Speed Printing on Thermal Sensitive Special Paper With A Resistive Ribbon Print Head", IBM Technical Disclosure Bulletin, vol. 27, No. 5, Oct. 1984, pp. 3059-3060.

Bazes, M., "Two Novel Fully Complementary Self-Biased CMOS Differential Amplifiers", IEEE Journal of Solid-State Circuits, vol. 26, No. 2, Feb. 1991, pp. 165-168.

Chapman, J. et al., "A Low-Cost High-Performance CMOS Timing Vernier for ATE", IEEE International Test Conference, Paper 21.2, 1995, pp. 459-468.

Cho, J. "Digitally-Controlled PLL with Pulse Width Detection Mechanism for Error Correction", ISSCC 1997, Paper No. SA 20.3, pp. 334-335.

Christiansen, J., "An Integrated High Resolution CMOS Timing Generator Based on an Array of Delay Locked Loops", IEEE Journal of Solid-State Circuits, vol. 31, No. 7, Jul. 1996, pp. 952-957.

Combes, M. et al., "A Portable Clock Multiplier Generator Using Digital CMOS Standard Cells", IEEE Journal of Solid-State Circuits, vol. 31, No. 7, Jul. 1996, pp. 958-965.

Donnelly, K. et al., "A 660 MB/s Interface Megacell Portable Circuit in 0.3 µm-0.7 µm CMOS ASIC", IEEE Journal of Solid-State Circuits, vol. 31, No. 12, Dec. 1996, pp. 1995-2001.

Goto, J. et al., "A PLL-Based Programmable Clock Generator with 50- to 350-MHz Oscillating Range for Video Signal Processors", IEICE Trans. Electron., vol. E77-C, No. 12, Dec. 1994, pp. 1951-1956.

Gustavsion, David B., et al., "IEEE Standard for Scalable Coherent Interface (SCI)," IEEE Computer Society, IEEE Std. 1596-1992, Aug. 2, 1993.

Hamamoto, T., "400-MHz Random Column Operating SDRAM Techniques with Self-Skew Compensation", IEEE Journal of Solid-State Circuits, vol. 33, No. 5, May 1998, pp. 770-778.

Ishibashi, A. et al., "High-Speed Clock Distribution Architecture Employing PLL for 0.6 µm CMOS SOG", IEEE Custom Integrated Circuits Conference, 1992, pp. 27.6.1-27.6.4.

Kim, B. et al., "A 30MHz High-Speed Analog/Digital PLL in 2 µm CMOS", ISSCC, Feb. 1990.

Kikuchi, S. et al., "A Gate-Array-Based 666MHz VLSI Test System", IEEE International Test Conference, Paper 21.1, 1995, pp. 451-458.

Ko, U. et al., "A 30-ps Jitter, 3.6-µs Locking, 3.3-Volt Digital PLL for CMOS Gate Arrays", IEEE Custom Integrated Circuits Conference, 1993, pp. 23.3.1-23.3.4.

Lee, T. et al., "A 2.5V Delay-Locked Loop for an 18Mb 500MB/s DRAM", IEEE International Solid-State Circuits Conference Digest of Technical Papers, Paper No. FA 18.6, 1994, pp. 300-301.

Lesmeister, G., "A Densely Integrated High Performance CMOS Tester", International Test Conference, Paper 16.2, 1991, pp. 426-429.

Ljuslin, C. et al., "An Integrated 16-channel CMOS Time to Digital Converter", IEEE Nuclear Science Symposium & Medical Imaging Conference Record, vol. 1, 1993, pp. 625-629.

Maneatis, J., "Low-Jitter Process-Independent DLL and PLL Based on Self-Biased Techniques", IEEE Journal of Solid-State Circuits, vol. 31, No. 11, Nov. 1996, pp. 1723-1732.

Nakamura, M. et al., "A 156 Mbps CMOS Clock Recovery Circuit for Burst-mode Transmission", Symposium on VLSI Circuits Digest of Technical Papers, 1996, pp. 122-123.

Nielson, E., "Inverting latches make simple VCO", EDN, Jun. 19, 1997.

Novof, I. et al., "Fully Integrated CMOS Phase-Locked Loop with 15 to 240 MHz Locking Range and ±50ps Jitter", IEEE Journal of Solid-State Circuits, vol. 30, No. 11, Nov. 1995, pp. 1259-1266.

Park, D. et al., "Fast Acquisition Frequency Synthesizer with the Multiple Phase Detectors", IEEE Pacific Rim Conference on Communications, Computers and Signal Processing, vol. 2, May 1991. pp. 665-668.

Saeki, T. et al., "A 2.5-ns Clock Access, 250-MHz, 256-Mb SDRAM with Synchronous Mirror Delay", IEEE Journal of Solid-State Circuits, vol. 31, No. 11, Nov. 1996, pp. 1656-1665.

Santos, D. et al., "A CMOS Delay Locked Loop And Sub-Nanosecond Time-to-Digital Converter Chip", IEEE Nuclear Science Symposium and Medical Imaging Conference Record, vol. 1, Oct. 1995, pp. 289-291.

Shirotori, T. et al., "PLL-based, Impedance Controlled Output Buffer", 1991 Symposium on VLSI Circuits Digest of Technical Papers, pp. 49-50.

Sidiropoulos, S. et al., "A 700-Mb/s/pin CMOS Signaling Interface Using Current Integrating Receivers", IEEE Journal of Solid-State Circuits, vol. 32, No. 5, May 1997, pp. 681-690.

Sidiropoulos, S. et al., "A CMOS 500 Mbps/pin synchronous point to point link interface", IEEE Symposium on VLSI Circuits Digest of Technical Papers, 1994, pp. 43-44.

Sidiropoulos, S. et al., "A Semi-Digital DLL with Unlimited Phase Shift Capability and 0.08-400MHz Operating Range," IEEE International Solid State Circuits Conference, Feb. 8, 1997, pp. 332-333.

Soyuer, M. et al., "A Fully Monolithic 1.25GHz CMOS Frequency Synthesizer", IEEE Symposium on VLSI Circuits Digest of Technical Papers, 1994, pp. 127-128.

Taguchi, M. et al., "A 40-ns 64-Mb DRAM with 64-b Parallel Data Bus Architecture", IEEE Journal of Solid-State Circuits, vol. 26, No. 11, Nov. 1991, pp. 1493-1497.

Tanoi, S. et al., "A 250-622 MHz Deskew and Jitter-Suppressed Clock Buffer Using a Frequency- and Delay-Locked Two-Loop Architecture", 1995 Symposium on VLSI Circuits Digest of Technical Papers, vol. 11, No. 2, pp. 85-86.

Tanoi, S. et al., "A 250-622 MHz Deskew and Jitter Suppressed Clock Buffer Using Two-Loop Architecture", IEEE IEICE Trans. Electron., vol. E-79-C. No. 7, Jul. 1996, pp. 898-904.

von Kaenel, V. et al., "A 320 MHz, 1.5 mW @ 1.35 V CMOS PLL for Microprocessor Clock Generation", IEEE Journal of Solid-State Circuits, vol. 31, No. 11, Nov. 1996, pp. 1715-1722.

Watson, R. et al., "Clock Buffer Chip with Absolute Delay Regulation Over Process and Environmental Variations", IEEE Custom Integrated Circuits Conference, 1992, pp. 25.2.1-25.2.5.

Yoshimura, T. et al. "A 622-Mb/s Bit/Frame Synchronizer for High-Speed Backplane Data Communication", IEEE Journal of Solid-State Circuits, vol. 31, No. 7, Jul. 1996, pp. 1063-1066.

* cited by examiner

METHOD AND APPARATUS FOR GENERATING A PHASE DEPENDENT CONTROL SIGNAL

CROSS-REFERENCE TO RELATED APPLICATIONS

This application is a continuation of U.S. patent application Ser. No. 10/186,471, filed Jun. 28, 2002, now U.S. Pat. No. 7,016,451 which is a continuation of U.S. patent application Ser. No. 09/260,212, filed Mar. 1, 1999, issued Oct. 22, 2002 as U.S. Pat. No. 6,470,060 B1.

TECHNICAL FIELD

This invention relates to generating a control signal and, more particularly, to generating a control signal based on the phase relationship between two input clock signals, and to memory devices and computer systems using such control signal generators.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium II® microprocessors are currently available that operate at clock speeds of at least 400 MHz. However, the remaining components of existing computer systems, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a frequency that is substantially lower than the clock frequency of the processor. Currently, for example, a processor having a 300 MHz clock frequency may be mounted on a mother board having a 66 MHz clock frequency for controlling the system memory devices and other components.

Access to system memory is a frequent operation for the processor. The time required for the processor, operating, for example, at 300 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a packetized memory device known as a SLDRAM memory device. In the SLDRAM architecture, the system memory may be coupled to the processor, either directly through the processor bus or through a memory controller. Rather than requiring that separate address and control signals be provided to the system memory, SLDRAM memory devices receive command packets that include both control and address information. The SLDRAM memory device then outputs or receives data on a data bus that may be coupled directly to the data bus portion of the processor bus. A master clock signal transmitted to each memory device is used to synchronize data transfer between the processor and memory device and also serves as a basis from which to generate internal clock signals coordinating internal memory operations.

One of the factors limiting the access speed of SLDRAM memory devices is the speed at which the command buffer of each device can store and process the command packets. The processing speed of the command buffer is dependent on the control of the relative timing between transmission of the command packets from the processor and an internal clock signal ICLK of the memory device used to trigger a latch in the command buffer to capture the command signals. Both the command signals and the ICLK signal are delayed relative to receipt of the command packet on a command bus and a command clock signal CMDCLK. Furthermore, the amount of the delay is highly variable, and it is difficult to control. If the delay of the internal clock signal ICLK cannot be precisely controlled, it may cause the latch in the command buffer to latch invalid command signals. Thus, the speed at which command packets can be applied to the memory device is limited by the delays in the memory device. Similar problems exist for other control signals in the memory device that control the operation of the memory device during each clock cycle, such as latching of data in the memory device and in a memory controller.

Consequently, the operation of a SLDRAM memory architecture necessitates the generation of a sequence of clock signals having predetermined phases relative to a master clock signal. Phase-locked and delay locked loops have been employed to ensure the precise phase relationship between clock signals. In such a closed loop, there is typically a phase detector receiving two clock signals, and a voltage controlled delay circuit through which one clock signal passes. The voltage controlled delay circuit receives control signals from the phase detector that are used adjust the variable delay value in order to establish a predetermined phase relationship between the two clock signals. For example, where the desired phase relationship between two clock signals is zero degrees, the phase detector will detect any phase difference between the two clock signals and generate a control signal that is transmitted to the voltage controlled delay circuit. The delay circuit will adjust the delay value according to the control signal until the clock signal passing through the voltage controlled delay circuit is synchronized with the other clock signal. The clock control circuitry in an SLDRAM is described in greater detail in U.S. patent application Ser. Nos. 08/879,847, 08/890,055, 08/933,324, 08/994,461, 09/146,716, and 09/150,079, which are incorporated herein by reference.

Figure 1:
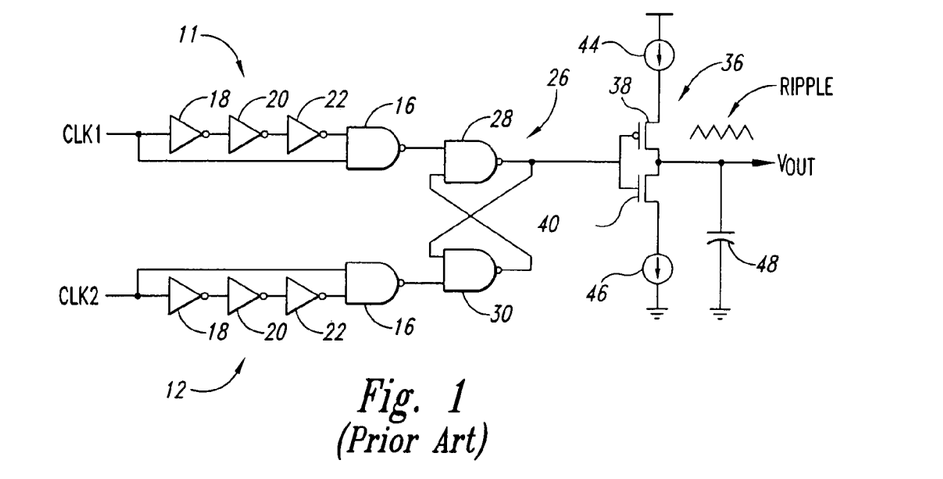
FIG. 1 is a logic diagram of a conventional phase detector circuit and charge pump.

A single phase detector connected to a CMOS inverter has been used as a means of providing a control signal to the above-described voltage controlled delay circuits. As shown in FIG. 1, clock signals CLK1 and CLK2 are applied to two pulse generating circuits 11, 12, each of which includes a NAND gate 16 receiving a respective clock signal directly and through three series connected inverters 18, 20, 22. The output of each pulse generating circuit 11, 12 set and reset a flip-flop 26 formed by cross-coupled NAND gates 28, 30. A single output of the flip-flop 26 is connected to the gates of an inverter 36 formed by a PMOS transistor 38 and an NMOS transistor 40. A current source 44 supplies current to the source of the PMOS transistor 38, and a current sink 46 draws current from the source of the NMOS transistor 40. When the output from the flip-flop 26 is low, the PMOS transistor 38 is turned ON and the NMOS transistor 40 is turned OFF. In this condition, a conductive path is created for the current source 44 to couple current to a capacitor 48. A control signal VOUT is generated by the capacitor 48. When the current source 44 is applying current to the capacitor 48, the voltage of the control signal VOUT increases linearly. In the alternative case where the output from the flip-flop 26 is high, the PMOS transistor 38 is switched OFF and the NMOS transistor 40 is switched ON. The current sink 46 is then coupled to the capacitor 48 to draw current from the capacitor 48. The voltage of the control signal VOUT then decreases linearly. As a result, the control signal VOUT has a sawtooth waveform component.

The problem with using a single phase detector connected to an inverter 36, as shown in FIG. 1, is that even after the voltage controlled delay circuit has been adjusted so the clock signals have the predetermined phase relationship, the circuit will nevertheless continue to generate a sawtooth ripple voltage at its output. The sawtooth waveform component of the control signal VOUT is transmitted to the voltage controlled delay circuit (not shown in FIG. 1), which is forced to constantly adjust the delay value, and consequently, the phase relationship between the two clock signals CLK1 and CLK2. The closed loop system will oscillate around a center-point and continue to "hunt" for the optimum control voltage value.

The result is a "phase jitter" imparted to clock signals used to latch command and data signals. Although the phase jitter introduced by the sawtooth ripple voltage may be acceptable in some applications, in high speed memory applications where the clock frequencies are high and the need to control the phase relationship between clock signals is critical, the clocks signals may fail to correctly latch command and data signals.

To accommodate the problems associated with the sawtooth ripple, the memory system designer may relax the timing requirements of the memory system by slowing down the clock frequencies and reducing the operating speed of the memory device. However, this approach defeats the primary purpose of developing high speed memory systems. Therefore, there is a need for a phase detector that generates a control signal that does not vary when the input clock signals have been adjusted to a predetermined phase relationship.

SUMMARY OF THE INVENTION

In one aspect of the invention, a phase detector having a phase detector circuit and a current source is provided. The phase detector circuit is configured to generate first and second phase dependent signals indicative of the phase relationship of first and second input clock signals. The current source is coupled to the phase detector circuit and is configured to provide an output current having a first polarity, an output current having a second opposite polarity, or provide no output current in accordance with the first and second phase dependent signals from the phase detector circuit.

In another aspect of the invention, a phase detector having a phase detector circuit and an output circuit is provided. The phase detector circuit is configured to generate first and second phase dependent signals indicative of the phase relationship of first and second input clock signals and the an output circuit is configured to provide an output signal having an increasing magnitude, a decreasing magnitude, or a constant magnitude in accordance with the first and second phase dependent signals from the phase detector circuit.

In another aspect of the invention, a phase detector having a phase detector circuit and an output circuit is provided. The phase detector circuit has first and second input nodes to receive first and second clock signals and further has first and second output nodes. The phase detector circuit is configured to produce a first output signal at the first output node and produce a second output signal at the second output node. The first output signal has a duty cycle related to the phase relationship between a rising edge of the first and second clock signals and the second output node has a duty cycle related to the phase relationship between a falling edge of the first and second clock signals. The output circuit has first and second input nodes coupled to a respective output node of the phase detector circuit and further has an output. The output circuit is configured to provide an output signal having an increasing magnitude, an output signal having a decreasing magnitude, or an output signal having a constant magnitude according to the relative duty cycles of the first and second output signals.

BRIEF DESCRIPTION OF THE DRAWINGS

FIG. 4, comprising

DETAILED DESCRIPTION OF THE INVENTION

Figure 2:
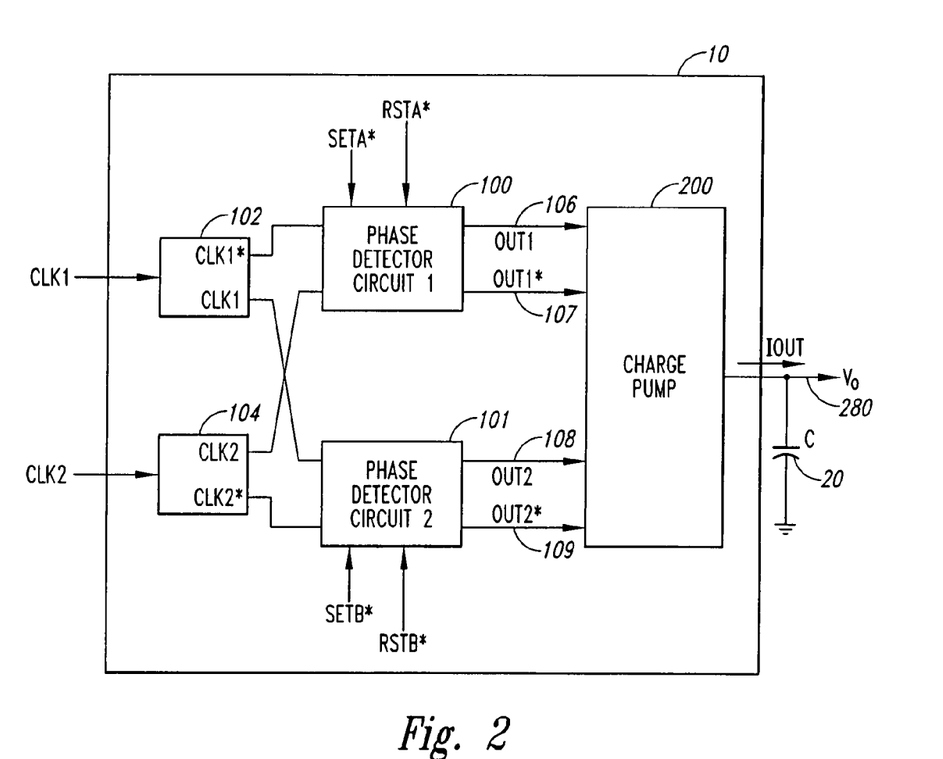
FIG. 2 is a block diagram illustrating a phase detector including two phase detector circuits connected to a charge pump.

An embodiment of a phase detector 10 in accordance with the present invention is illustrated in FIG. 2. The phase detector includes two single-to-dual signal converters 102, 104 that receive input clock signals CLK1, CLK2, respectively, and produce complementary clock signals CLK1*, CLK2* and non-complementary clock signals CLK1, CLK2 based on the original input clock signals. The single-to-dual signal converters may be implemented using a variety of designs known to one skilled in the art. For example, an inverter and transfer gate having the same propagation delay connected in parallel will produce a complementary and a non-complementary signal from an input clock signal. The CLK1, CLK1*, CLK2, CLK2* signals are transmitted to two phase detector circuits 100, 101 that produce select signals OUT1, OUT1*, OUT2, OUT2* and transmits them to a phase dependent signal source or a charge pump 200 via signal lines 106, 107, 108, 109, respectively. The charge pump 200 in turn generates an output current IOUT according to the OUT1, OUT1* signals from the phase detector circuit 100, and the OUT2, OUT2* signals from the phase detector circuit 101. The IOUT current may be converted into a control signal $V_O$ by capacitor 20 connected to an output 280, and the control signal $V_O$ may be used to adjust the delay value of a voltage controlled delay circuit.

Figure 3:
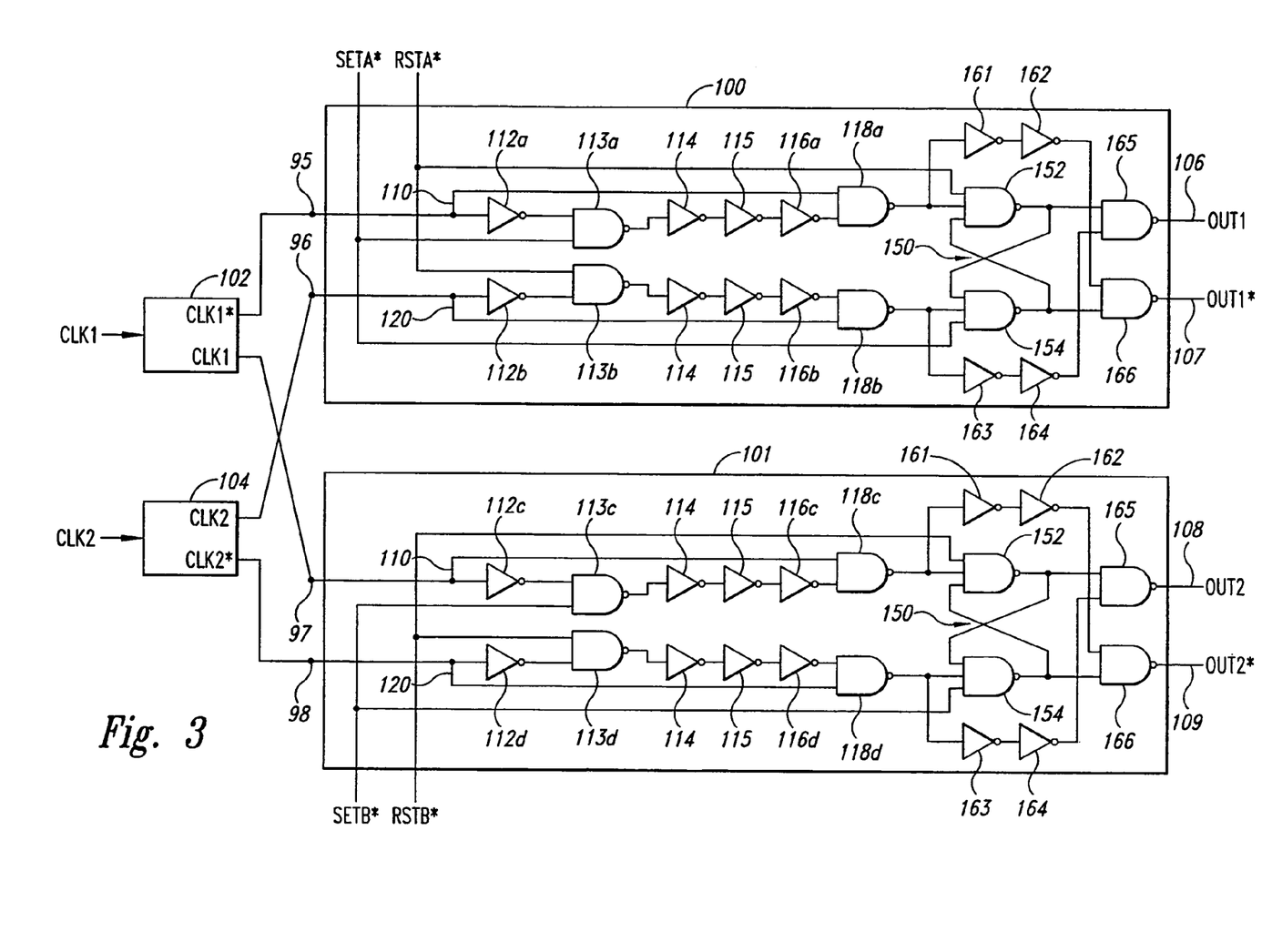
FIG. 3 is a logic diagram of the phase detector circuits of FIG. 2 in accordance with an embodiment of the present invention.

FIG. 3 illustrates an embodiment of the phase detector circuits 100, 101 in greater detail. Each detector circuit 100, 101 consists of two signal transition detectors 110, 120 that generate a trigger pulse upon detecting a low-to-high transition of an input clock signal it receives. Each detector circuit 100, 101 also includes a dual output flip-flop 150 that is set and reset by the trigger pulses it receives from the signal transitions detectors 110, 120. Each flip-flop 150 is formed by a pair of cross-coupled NAND gates 152, 154. The output from the phase detector circuits 100, 101 are applied to NAND gates 165, 166 through inverters 161-164. Each NAND gate 165, 166 also receives a respective input signal from the flip-flop 150. The combination of inverters 161-164 and NAND gates 165, 166 creates a buffer circuit that will cause the respective NAND gates 165, 166 to immediately switch upon receiving a trigger pulse from the respective signal transition detector, as explained below.

Each phase detector circuit 100, 101 receives a pair of active-low control signals, SETA*, RSTA*, and SETB*, RSTB*, respectively. The SETA* and RSTA* signals are applied to the phase detector circuit 100, and the SETB* and RSTB* signals are applied to the phase detector circuit 101. The control signals are generated by a control circuit (not shown), and are used to put each phase detector circuit 100, 101 into a predetermined state. Signal RSTA* is provided directly to the NAND gate 152 of the flip-flop 150 and the NAND gate 113 of the signal transition detector 120, and signal SETA* is provided directly to the NAND gate 154 of the flip-flop 150 and the NAND gate 113 of the signal transition detector 110. The RSTB*, SETB* signals are similarly provided to the respective NAND gates of the phase detector circuit 101.

To illustrate the operation of the control signals, consider the effect the SETA*, RSTA* signals have on phase detector circuit 100. During normal operation of the phase detector circuit 100, the RSTA* and SETA* signals are both high. In this situation, the NAND gates 113 of the signal transition detectors 110, 120 behave as inverters, and the NAND gates 152, 154 behave as simple two input NAND gates. However, when the SETA* signal goes low, the output of the NAND gates 113a and 154 are forced high. Consequently, the NAND gate 118a outputs a high to the NAND gate 152, and the NAND gate 118b outputs a low that sets the flip-flop 150. The OUT1 signal is then forced high and the OUT1* signal is forced low. In a similar manner, when the RSTA* signal goes low, the flip-flop 150 is reset so that the OUT1 signal is forced low and the OUT1* signal is forced high. Control signals RSTB* and SETB* operate in the same manner for the phase detector circuit 101 by forcing the OUT2, OUT2* signals to a predetermined state when active. To simplify the explanation of the operation of the signal transition detectors 110, 120, it will be assumed that the SETA*, RSTA*, SETB*, and RSTB* signals are inactive (i.e., at a high signal level).

In operation, the CLK1, CLK2 signals are initially low thereby applying a low signal directly to one input of the NAND gates 118b, 118c and causing the inverters 116a, 116d to apply low signals to the other input of the NAND gates 118a, 118d, respectively. Thus, the NAND gates 118a-d initially output a high signal. When the respective clock signal goes high, e.g., the CLK1 signal, the NAND gate 118c outputs a low signal until the high signal has propagated through inverter 112c, NAND gate 113c, and through series inverters 114c, 115c, 116c. The inverter of 116c then applies a low signal to the NAND gate 118c, thereby causing the output of the NAND gate 118c to again go high. Thus, the signal transition detector 110 outputs a low-going pulse responsive to the CLK1 signal. The low-going pulse has a width equal to the total propagation delay through inverter 112, NAND gate 113, and series inverters 114, 115, 116. The signal transition detectors 110, 120 in the phase detector circuit 100, and the signal transition detector 120 in the phase detector circuit 101, each operate in the same manner to output a low pulse responsive to the rising edge of the clock signal to which it is connected.

The low-going pulse from each of the signal transition detectors 110, 120 sets or resets the flip-flops 150. More specifically, each flip-flop 150 is set by each pulse from the respective signal transition detector 110, thereby causing the NAND gate 152 to output a high signal and the NAND gate 154 to output a low signal. Each flip-flop 150 is reset by each pulse from the respective signal transition detector 120, thereby causing the NAND gate 152 to output a low signal and NAND gate 154 to output a high signal. The output of NAND gates 152, 154 are then inverted by NAND gates 165, 166, respectively, of the buffer circuit to provide the OUT1, OUT1*, OUT2, OUT2* signals to the charge pump 200. As a result, the OUT1 signal is high during the period between the rising edge of the CLK2 signal and the falling edge of the CLK1 signal (i.e., the rising edge of the CLK1* signal). In a similar manner, the OUT2 signal generated by the detector circuit 101 is high during the period between the falling edge of the CLK2 signal (i.e., the rising edge of the CLK2* signal) and the rising edge of the CLK1 signal.

To illustrate the operation of the phase detector circuits 100, 101, consider three situations: first, where CLK1 and CLK2 are in phase; second, where CLK1 is leading CLK2 by ϕ; and third, where CLK1 is lagging CLK2 by ϕ.

Figure 4A:
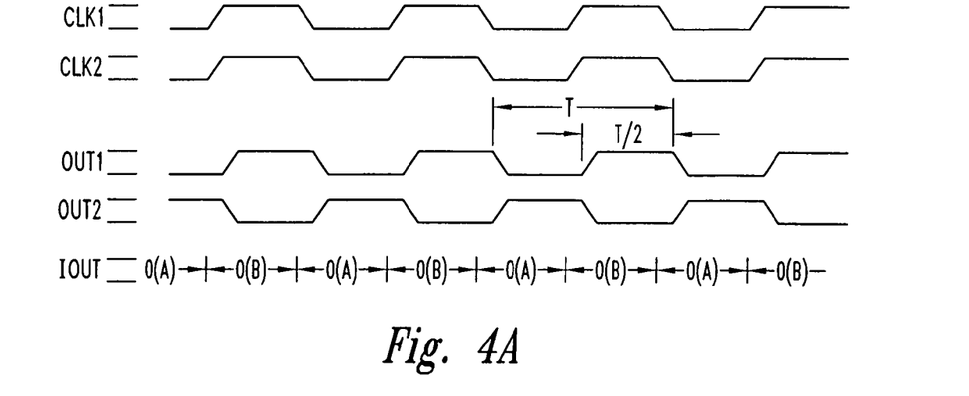
FIGS. 4a-4c, is a timing diagram showing several of the waveforms present in the phase detector circuits.

The phase relationship when the CLK1 and CLK2 signals are in phase is illustrated in FIG. 4a. As explained above, the OUT1 signal from the phase detector circuit 100 switches from low to high on the rising edge of the CLK2 signal, and from high to low on the falling edge of the CLK1 signal. Also, the OUT2 signal from the phase detector circuit 101 switches from low to high on the falling edge of the CLK2 signal, and from high to low on the rising edge of the CLK1 signal. Since the CLK1 signal is shown in FIG. 4a as being in phase with the CLK2 signal, the duty cycles of the OUT1 and OUT2 signals are both 50 percent, and the two signals will never be at the same logic level simultaneously.

Figure 4B:
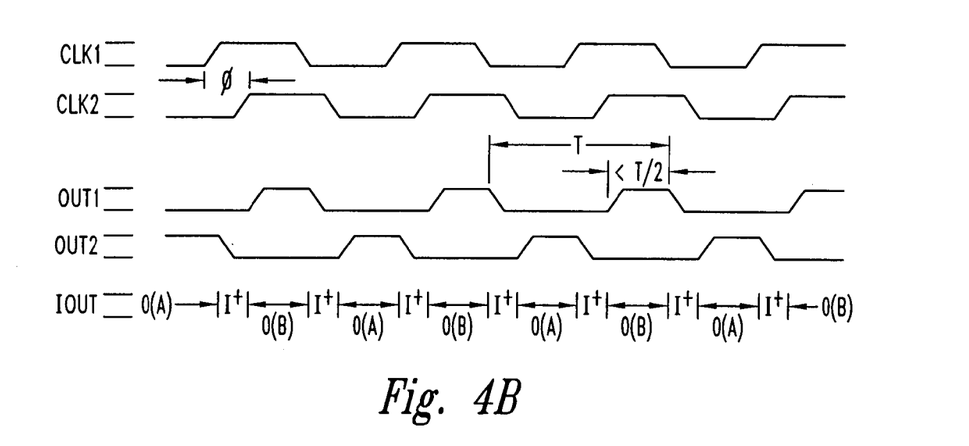
Figure 4C:
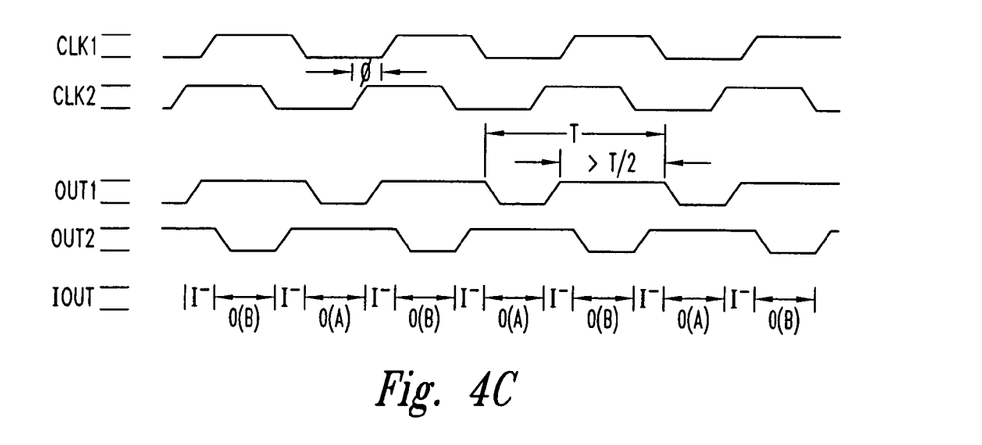

Now consider the case where CLK1 is leading CLK2 by ϕ, as shown in FIG. 4b. When CLK1 is leading CLK2 by ϕ, the OUT1 signal from the phase detector circuit 100 and the OUT2 signal from phase the detector circuit 101 have duty cycles less than 50 percent, and may be at a low logic level simultaneously. Finally, consider the case where CLK1 is lagging CLK2 by ϕ, as shown in FIG. 4c. When CLK1 is lagging CLK2 by ϕ, the resulting OUT1 and OUT2 signals from phase detector circuits 100 and 101, respectively, have duty cycles greater than 50 percent. Thus, the OUT1 and OUT2 signals may be at a high logic level simultaneously.

Figure 5:
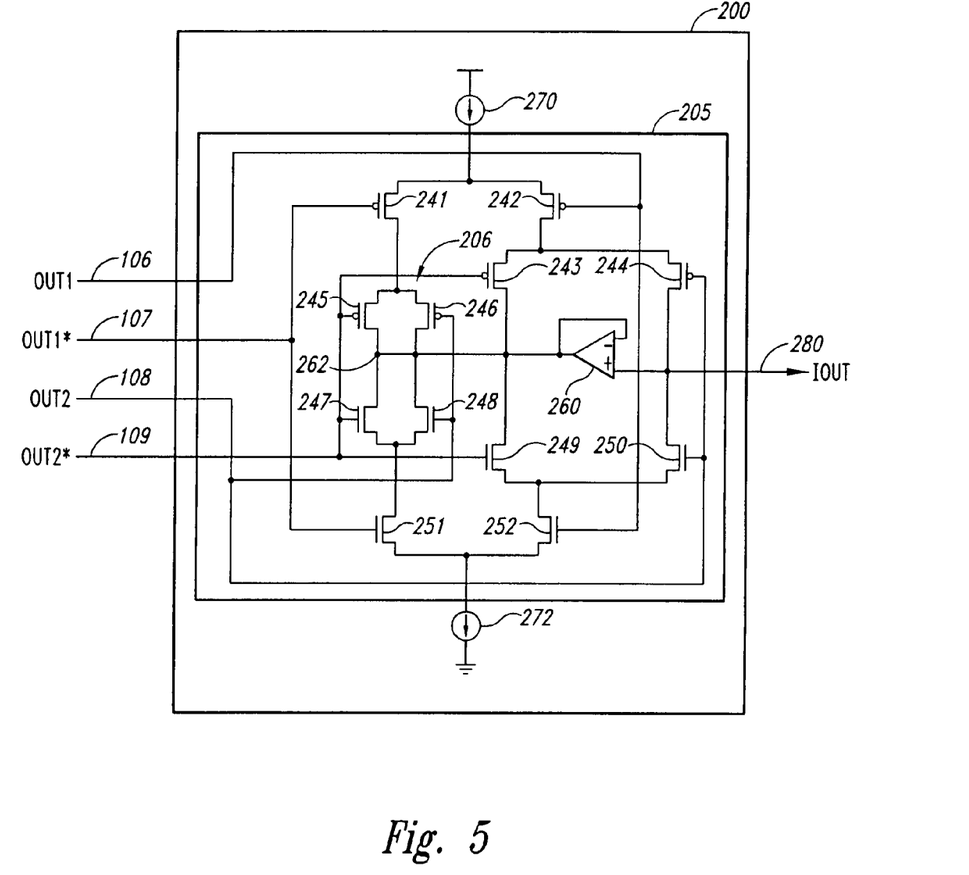
FIG. 5 is a logic diagram of the charge pump of FIG. 2 in accordance with an embodiment of the present invention.

The OUT1, OUT1*, OUT2, OUT2* signals are transmitted from the phase detector circuits 100, 101 on signal lines 106, 107, 108, 109, respectively, to the input of a charge pump, such as a charge pump 200, as shown in FIG. 5. The charge pump 200 includes a charging circuit 205, a current source 270, and a current sink 272. The function of the charging circuit 205 is to direct the current of the current source 270 and current sink 272 into, or out of the capacitor 20 (FIG. 2), respectively, depending upon the relative duty cycles of the OUT1 and OUT2 signals. Significantly, no current flows into or out of the capacitor 20 when the CLK1 and CLK2 signals are in phase. Thus, the resulting control signal may have virtually no ripple when the phase detector 10 (FIG. 2) is used in a voltage controlled delay circuit, as explained above. A clock signal generated using the voltage controlled delay circuit has significantly less phase jitter compared to a clock signal generated by a voltage controlled delay circuit using the phase detector of FIG. 1.

The charge pump 200 includes transistors 245-248 on the left leg of the charging circuit 205 to form a compensation circuit 206 to compensate for current and voltage changes in a current driving circuit formed by transistors 243, 244, 249, and 250 on the right leg of the charging circuit 205. The compensation circuit 206 is provided so that the voltage across the charging circuit 205 is relatively constant during operation, regardless of where the currents of the current source 270 and the current sink 272 are being directed.

A voltage follower 260 is connected between the output 280 of the charging circuit 205 and node 262 of the compensation circuit 206. The voltage follower 260 provides a current path from the current source 270 to ground when current from the current sink 272 is being directed out of the capacitor 20. The voltage follower 260 also provides a current path from the current sink 272 to the positive supply when current from the current source 270 is directed to the output 280. As will be explained in greater detail below, both of these situations occur where the CLK1 and CLK2 signals are not in phase. As a result, the current through the charging circuit 205 is through two PMOS transistors and two NMOS transistors when current is being directed into or out of the capacitor 20, namely, the transistors 242, 244, 247, 251 or the transistors 241, 245, 250, 252. Similarly, in the situations where no current is being directed into or out of the capacitor 20, the current through the charging circuit 205 is also through two PMOS transistors and two NMOS transistors, namely, the transistors 242, 243, 248, 251 or the transistors 241, 246, 249, 252. Consequently, the operating points of the active transistors will remain relatively constant, and any capacitive charge pumping on the internal nodes of the charging circuit 205 will be minimized. It will be appreciated by one ordinarily skilled in the art that the transistors of the charging circuit 205 must be scaled accordingly.

To illustrate the operation of the charge pump 200 in conjunction with the phase detector circuits 100, 101, consider again the three situations that were described earlier: where CLK1 and CLK2 are in phase; where CLK1 is leading CLK2 by ϕ; and where CLK1 is lagging CLK2 by ϕ.

As shown in FIG. 4a, when OUT1 is low and OUT2 is high the current provided by the current source 270 and sunk by the current sink 272 bypasses the output 280 of the charging circuit 205 and simply flows through the transistors 242, 243, 248, 251 (indicated in FIG. 4a as "0(A)"). Similarly, when OUT1 is high and OUT2 is low current flows from the current source 270 to the current sink 272 through the transistors 241, 246, 249, 252 (indicated in FIG. 4a as "0(B)"). In either case, the charging circuit 205 does not charge or discharge the capacitor 20 so the voltage on the capacitor 20 remains constant.

As shown in FIG. 4b, when both the OUT1 and OUT2 signals are low, the charging circuit 205 directs the current provided by the current source 270 through the PMOS transistors 242, 244 to charge the capacitor 20 (indicated in FIG. 4b as "I+"). A path for the current from the current sink 272 is provided through the voltage follower 260 and the NMOS transistors 247, 251. During the time the OUT1 and OUT2 signals are at different logic levels, the charging circuit 205 does not charge or discharge the capacitor 20 so the voltage on the capacitor 20 remains constant, as was previously explained (indicated in FIG. 4b as 0(A) or 0(B)).

As shown in FIG. 4c, when both the OUT1 and OUT2 signals are high, the NMOS transistors 250, 252 provide a conductive path for the current sink 272 to sink current from the capacitor 20 (indicated in FIG. 4c as "I−"). A current path for the current of the current source 270 is provided through the voltage follower 260 and the PMOS transistors 241, 245. As mentioned before, whenever the OUT1 and OUT2 signals are at different logic levels, the charging circuit 205 does not charge or discharge the capacitor 20 so the voltage on the capacitor 20 remains constant (indicated in FIG. 4c as 0(A) or 0(B)).

Any change in the control voltage $V_O$ depends upon whether current is flowing into or out of the capacitor 20, as explained above. When the CLK1 and CLK2 signals are in phase, as illustrated in FIG. 4a, OUT1 and OUT2 never have the same logic level so no current flows either into or out of the capacitor 20. In contrast, when the CLK1 signal and the CLK2 signal have different phases, OUT1 and OUT2 are both high or both low for a portion of each cycle. As illustrated in FIG. 4b, when the CLK1 signal leads the CLK2 signal, OUT1 and OUT2 are low for more than 50 percent of each cycle so that OUT1 and OUT2 are both low for a portion of each cycle. As a result, as explained above, current flows into the capacitor 20, thereby increasing the control voltage $V_O$. Similarly, when the CLK1 signal lags the CLK2 signal as illustrated in FIG. 4c, OUT1 and OUT2 are high for more than 50 percent of each cycle so that OUT1 and OUT2 are both high for a portion of each cycle. As a result, current flows out of the capacitor 20, thereby decreasing the control voltage $V_O$.

The discussion of the phase detector 10 has so far only considered the case where the CLK1 and CLK2 signals are adjusted so that they are approximately in phase. However, the phase detector 10 may be modified to produce a control signal that adjust the CLK1 and CLK2 signals to have a 180 degrees phase relationship. As shown in FIG. 3, the CLK1* and CLK2 signals are transmitted to nodes 95, 96 of the phase detector circuit 100, while the CLK1 and CLK2* signals are transmitted to nodes 97, 98 of the phase detector circuit 101, resulting in a phase detector that generates a non-varying control signal when the CLK1 and CLK2 signals are in phase. However, when the CLK1 and CLK1* signals are reconnected to the nodes 95 and 97, respectively, or the CLK2 and CLK2* signals are reconnected to the nodes 98 and 96, respectively, the phase detector circuits 100, 101 transmit the OUT1, OUT1*, OUT2, OUT2* signals to the charge pump 200 so that the phase detector 10 generates a non-varying control signal when the CLK1 and CLK2 signals have a 180 degree phase relationship.

The current source 270 and the current sink 272 of the charge pump 200 may be of any current source circuit known in the art. In a preferred embodiment, a high-swing cascode current mirror, as described in "CMOS Circuit Design, Layout, and Simulation," published by IEEE Press, is used for both the current source 270 and the current sink 272. The use of this particular current source is meant for illustrative purposes only, and is not intended to limit the scope of the present invention.

The charge pump 200 (FIG. 2) has been described with respect to the embodiment illustrated in FIG. 5. However, an integrator circuit using an operational amplifier may also be used for the charge pump 200. Such an integrator circuit is formed by coupling a capacitor across the output of the operational amplifier and the inverting input. The OUT1 and OUT2 signals generated by the phase detector circuits 100 and 101 are applied through two resistors of equal resistance to the non-inverting input of the operational amplifier, and the OUT1* and OUT2* signals are applied through two resistors of equal resistance to the inverting input. The resulting charge pump will generate increasing and decreasing control signals when the CLK1 and CLK2 signals are not in phase, and generate a control signal with virtually no ripple when the clock signals are in phase.

Figure 6:
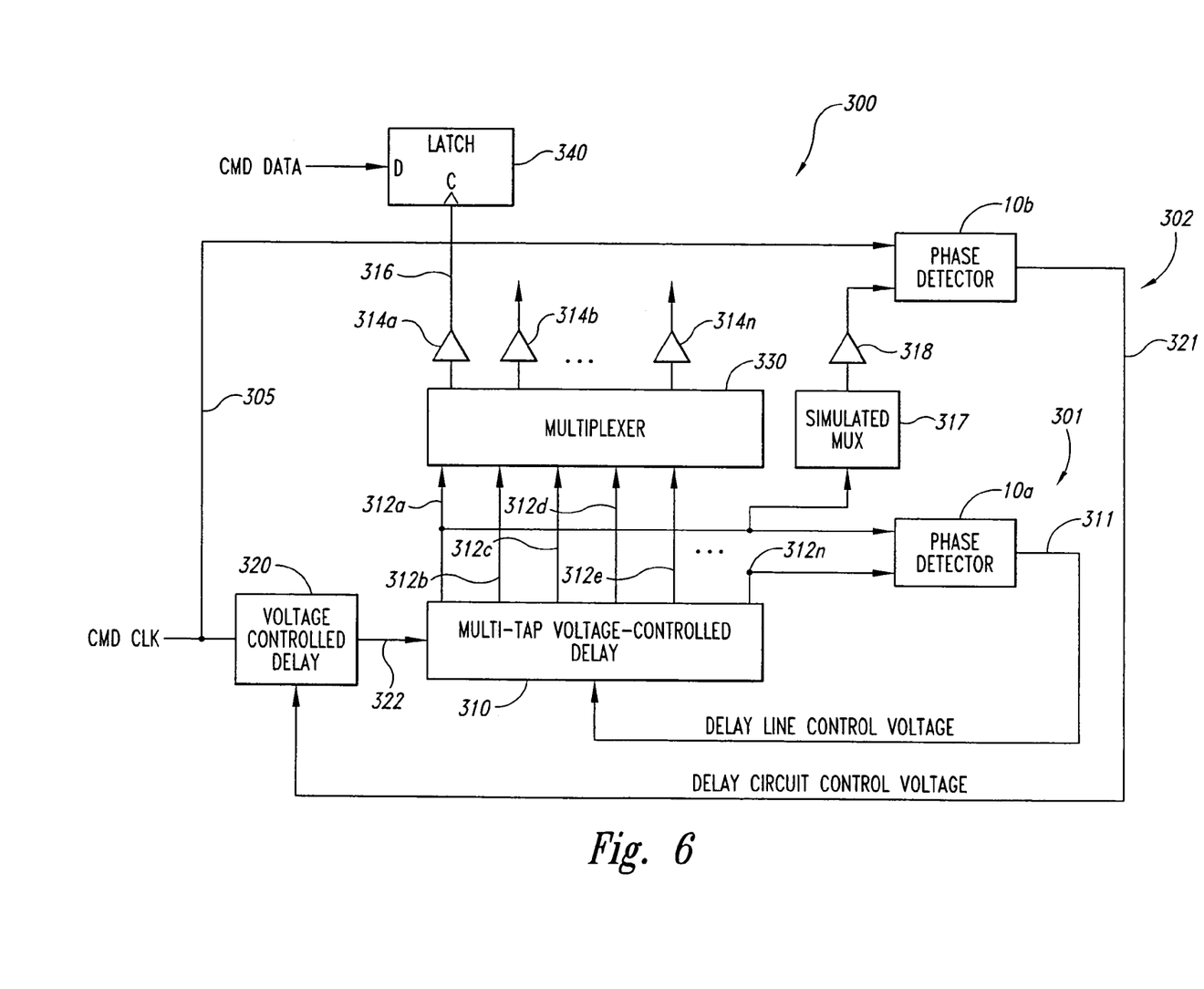
FIG. 6 is a block diagram of a clock generator circuit using an embodiment of the phase detector of FIG. 2.

Shown in FIG. 6 is a block diagram of a clock generator circuit that may be used in packetized DRAMs to provide a sequence of clock signals that have predetermined phases relative to a master clock signal. The clock generator circuit contains a first delay-locked loop 301 and a second delay-locked loop 302, each having a phase detector 10 of FIG. 2. A multiplexer 330 having a plurality of output lines coupled to respective clock drivers 314a-n may be coupled to the first delay-lock loop 301 to couple one of the clock signals produced by the multi-tap voltage controlled delay circuit 310 to a clock output terminal 316 for use, for example, with a latch 340 to latch command data CMD DATA in packetized DRAM. The multiplexer 330 couples the input of each of the clock drivers 314a-n to any one of the clock signals produced by the multi-tap voltage controlled delay circuit 310.

The first delay-locked loop includes a multi-tap voltage controlled delay circuit 310 and a first phase detector 10a. The multi-tap voltage controlled delay circuit 310 generates a sequence of clock signals on output lines 312a-312n that are increasingly delayed from a first clock signal on line 312a to a last clock signal on line 312n. Two of the clock signals, preferably the first and last clock signals, are locked to each other using the delay-locked loop 301 so that they have a predetermined phase with respect to each other. For example, the first clock signal on line 312a and the last clock signal on line 312n may be locked so that they are the inverse of each other, that is, the predetermined phase relationship is 180 degrees from each other. Alternatively, the predetermined phase relationship could be 360 degrees so the first and last clock signals are in phase. The first phase detector 10a compares the phase of the clock signals on lines 312a and 312n and generates the first control signal as a function of the phase difference therebetween. The first control signal is provided to the multi-tap voltage-controlled delay circuit 310 on line 311 to adjust the relative delay between the clock signal on line 312a and line 312n. The phase detector 10a will continue to provide the first control signal until the first and last clock signals have obtained the predetermined phase relationship.

Likewise, the second delay-locked loop 302 includes a second voltage controlled delay circuit 320 and a second phase detector 10b. A second delay-locked loop locks a clock signal from the multi-tap voltage controlled circuit 310 to a master clock signal CMD CLK on line 305 so that the increasingly delayed clock signals of the multi-tap voltage controlled delay circuit 310 have phase delays with respect to the CMD CLK signal. The clock signal from the multi-tap voltage controlled circuit 310 is provided to an input of the second phase detector 10b through a simulated multiplexer 317 and a clock driver 318. The relative phase delays of the simulated multiplexer 317 and the clock driver 318 are nearly identical to that of the multiplexer 330 and the clock drivers 314a-n. Consequently, the phase detector 10b will receive a clock signal having the same relative phase delay as a clock signal output by the clock drivers 314a-n.

For example, the second delay-lock loop 302 may delay lock the first clock signal on line 312a to the CMD CLK signal so that they have substantially the same phase, that is, the predetermined phase relationship is zero degrees from each other. The voltage controlled delay circuit 320 receives the CMD CLK signal and generates a reference clock signal on line 322 having a delay relative to the CMD CLK signal that is a function of a second control signal on line 321. The clock signal on line 322 is provided to the multi-tap voltage controlled circuit 310 and used to generate the sequence of increasingly delayed clock signals 312a-312n.

The second phase detector 10b compares the phase of the CMD CLK signal to the phase of the first clock signal on line 312a and generates a second control signal as a function of the difference therebetween. The clock signal provided to the phase detector 10b is delayed through the simulated multiplexer 317 and the clock driver 318 approximately the same amount as the clock signals output by the clock drivers 314a-n. The second control signal is used to adjust the delay value of the voltage controlled delay circuit 320. The second control signal is provided by the second phase detector 10b until the CMD CLK signal and the first clock signal from the multi-tap voltage controlled circuit 310 have obtained the predetermined phase relationship. The clock generator circuit of FIG. 6 is described in greater detail in U.S. patent application Ser. No. 08/879,847, which, as mentioned above, has been incorporated herein by reference.

Figure 7:
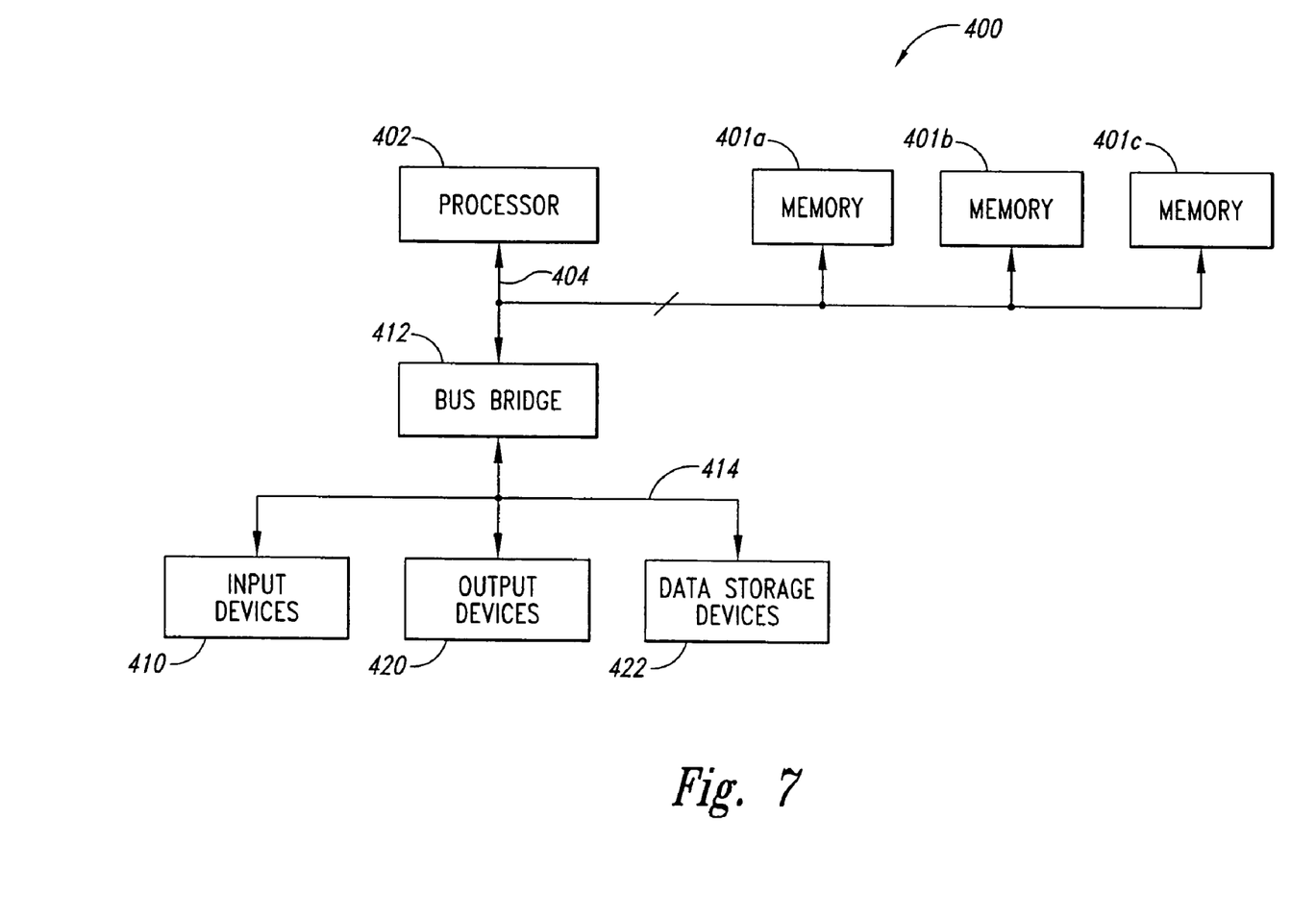
FIG. 7 is a block diagram of a computer system using a plurality of DRAMs, each of which includes the phase detector of FIG. 2.

A computer system using the phase detector 10 of FIG. 2 in each of a plurality of packetized DRAMs 401 is shown in FIG. 7. With reference to FIG. 7 the computer system 400 includes a processor 402 having a processor bus 404 coupled to three packetized dynamic random access memory or SLDRAMs 401a-c. The computer system 400 also includes one or more input devices 410, such as a keypad or a mouse, coupled to the processor 402 through a bus bridge 412 and an expansion bus 414, such as an industry standard architecture ("ISA") bus or a Peripheral component interconnect ("PCI") bus. The input devices 410 allow an operator or an electronic device to input data to the computer system 400. One or more output devices 420 are coupled to the processor 402 to display or otherwise output data generated by the processor 402. The output devices 420 are coupled to the processor 402 through the expansion bus 414, bus bridge 412 and processor bus 404. Examples of output devices 420 include printers and video display units. One or more data storage devices 422 are coupled to the processor 402 through the processor bus 404, bus bridge 412, and expansion bus 414 to store data in or retrieve data from storage media (not shown). Examples of storage devices 422 and storage media include fixed disk drives floppy disk drives, tape cassettes and compact-disk read-only memory drives.

In operation, the processor 402 communicates with the memory devices 401a-c via the processor bus 404 by sending the memory devices 401a-c command packets that contain both control and address information. Data is coupled between the processor 402 and the memory devices 401a-c, through a data bus portion of the processor bus 404. Although all the memory devices 401a-c are coupled to the same conductors of the processor bus 404, only one memory device 401a-c at a time reads or writes data, thus avoiding bus contention on the processor bus 404. Bus contention is avoided by each of the memory devices 401a-c and the bus bridge 412 having a unique identifier, and the command packet contains an identifying code that selects only one of these components.

The computer system 400 also includes a number of other components and signal lines which have been omitted from FIG. 7 in the interests of brevity. For example, as explained above, the memory devices 401a-c also receive a command or master clock signal to provide internal timing signals, a data clock signal clocking data into and out of the memory device 401a-c, and a FLAG signal signifying the start of a command packet.

From the foregoing it will be appreciated that, although specific embodiments of the invention have been described herein for purposes of illustration, various modifications may be made without deviating from the spirit and scope of the invention. For example, the signal transition detector circuits 110, 120 have been described as generating a negative trigger pulse upon detecting a transition of an input signal. However, using cross-coupled NOR gates instead of cross-coupled NAND gates for the flip-flop 150 allows the use of a signal transition detector that generates a positive trigger pulse. Also, the charge pump 200 shown in FIG. 5 is described as generating a current output signal IOUT having a positive polarity when CLK1 is leading CLK2, and having a negative polarity when CLK1 is lagging CLK2. However, the connection of the OUT1, OUT1*, OUT2, OUT2* signals to the transistors 241-252 of the charging circuit 205 may be modified so that the IOUT signal will have a negative polarity when CLK1 is leading CLK2, and have a positive polarity when CLK1 is lagging CLK2. Accordingly, the invention is not limited except as by the appended claims.

The invention claimed is:

1. A phase detector, comprising:
a first phase detector circuit having first and second clock signal transition detectors and a flip-flop, each clock signal transition detector having an input to receive a respective one of first and second input clock signals, the flip-flop having first and second inputs coupled to the output of a respective one of the clock signal transition detectors and further having an output corresponding to an output of the first phase detector;
a second phase detector circuit having first and second inputs to receive the first and second clock signals, respectively, and further having an output; and
an output circuit having first and second inputs coupled to the outputs of the first and second phase detector circuits and further having an output, the output circuit configured to provide an output current having a first polarity, an output current having a second opposite polarity, or no output current in response to output signals from the first and second phase detector circuits.

2. The phase detector of claim 1 wherein the second phase detector circuit comprises first and second clock signal transition detectors coupled to a respective input of the second phase detector circuit, and a flip flop coupled to the first and second clock signal transition detectors, the first phase detector circuit configured to generate an output signal having a duty cycle according to the phase relationship between a first clock edge of the first and second clock signals, and the second phase detector circuit configured to generate an output signal having a duty cycle according to the phase relationship between a second clock edge of the first and second clock signals.

3. The phase detector of claim 2 wherein the output circuit comprises:
a first current circuit;
a second current circuit; and
a switching circuit configured to selectively couple and decouple the output of the output circuit from the first and second current circuits responsive to the relative duty cycles of the output signals from the first and second phase detector circuits.

4. The phase detector of claim 3 wherein the output circuit provides a positive current in response to the output signal of the first phase detector circuit having a greater duty cycle than the output signal of the second phase detector circuit and a negative current in response to the output signal of the second phase detector circuit having a greater duty cycle than the output signal of the first phase detector circuit.

5. The phase detector of claim 1, further comprising a capacitor coupled to the output of the output circuit.

6. A phase detector, comprising:
a phase detector circuit having first and second input nodes to receive first and second clock signals and further having first and second output nodes, the phase detector circuit configured to produce a first output signal at the first output node having a duty cycle related to the phase relationship between a rising edge of the first and second clock signals and produce a second output signal at the second output node having a duty cycle related to the phase relationship between a falling edge of the first and second clock signals, wherein the phase detector circuit comprises first and second circuits, each circuit including first and second transition detectors and a flip-flop coupled to the first and second transition detectors, each of the transition detectors having an input to receive a respective one of the first and second clock signals and configured to produce a respective trigger pulse provided to the flip-flop in response to a transition in the respective clock signal; and
an output circuit having first and second input nodes coupled to a respective output node of the phase detector circuit and further having an output, the output circuit configured to provide an output signal having an increasing magnitude, an output signal having a decreasing magnitude, or an output signal having a constant magnitude according to the relative duty cycles of the first and second output signals.

7. The phase detector of claim 6 wherein the output circuit comprises:
a first current circuit;
a second current circuit;
a switching circuit configured to selectively couple and decouple the output of the output circuit from the first and second current circuits responsive to the relative duty cycles of the first and second output signals; and
a capacitor coupled to the output of the output circuit.

8. The phase detector of claim 7 wherein the output circuit is configured to provide a positive current in response to the first output signal having a greater duty cycle than the second output signal and a negative current in response to the second output signal having a greater duty cycle than the first output signal.

9. A phase detector, comprising:
a phase detector circuit configured to generate first and second phase dependent signals indicative of the phase relationship of first and second input clock signals, the phase detector circuit comprising: first phase detector circuitry having first and second inputs to receive the first and second clock signals, respectively, and further having an output to provide a first phase dependent output signal; and second phase detector circuitry having first and second inputs to receive the first and second clock signals, respectively, and further having an output to provide a second phase dependent output signal; and
a current source coupled to the phase detector circuit and configured to provide an output current having a first polarity, an output current having a second opposite polarity, or provide no output current in accordance with the first and second phase dependent signals from the phase detector circuit.

10. The phase detector of claim 9 wherein the first phase detector circuitry comprises:
first and second clock signal transition detectors, each clock signal transition detector having an input to receive a respective one of first and second input clock signals and configured to produce a trigger pulse at an output in response to a transition in the respective clock signal; and
a flip-flop having first and second inputs coupled to the output of a respective one of the clock signal transition detectors and further having an output corresponding to an output of the first phase detector circuitry.

11. The phase detector of claim 9 wherein the first phase detector circuitry is configured to generate the first phase dependent output signal having a duty cycle related to the phase relationship between a rising edge of the first and second input clock signals and the second phase detector circuitry is configured to generate the second phase dependent output signal having a duty cycle related to the phase relationship between a falling edge of the first and second clock signals.

12. The phase detector of claim 11 wherein the current source comprises:
a first current circuit;
a second current circuit; and
a switching circuit configured to selectively couple and decouple an output of the current source from the first and second current circuits responsive to first and second phase dependent output signals.

13. The phase detector of claim 12 wherein the current source is configured to provide a positive current in response to the first phase dependent output signal having a greater duty cycle than the second phase dependent output signal and a negative current in response to the second phase dependent output signal having a greater duty cycle than the first phase dependent output signal.

14. The phase detector of claim 13, further comprising a capacitor coupled to the output of the current source.

15. A phase detector, comprising:
a phase detector circuit configured to generate first and second phase dependent signals indicative of the phase relationship of first and second input clock signals; the phase detector circuit comprising: first phase detector circuitry having first and second inputs to receive the first and second clock signals, respectively, and further having an output to provide a first phase dependent output signal; and second phase detector circuitry having first and second inputs to receive the first and second clock signals, respectively, and further having an output to provide a second phase dependent output signal; and
an output circuit coupled to the phase detector circuit and configured to provide an output signal having an increasing magnitude, a decreasing magnitude, or a constant magnitude in accordance with the first and second phase dependent signals from the phase detector circuit.

16. The phase detector of claim 15 wherein the first phase detector circuitry is configured to generate the first phase dependent output signal having a duty cycle related to the phase relationship between a rising edge of the first and second input clock signals and the second phase detector circuitry is configured to generate the second phase dependent output signal having a duty cycle related to the phase relationship between a falling edge of the first and second clock signals.

17. The phase detector of claim 15 wherein the output circuit comprises:
a first current circuit;
a second current circuit;
a switching circuit configured to selectively couple and decouple the output of the output circuit from the first and second current circuits responsive to the relative duty cycles of the first and second output signals; and
a capacitor coupled to the output of the output circuit.

18. The phase detector of claim 17 wherein the output circuit is configured to provide a positive current in response to the first output signal having a greater duty cycle than the second output signal and a negative current in response to the second output signal having a greater duty cycle than the first output signal.

* * * * *